(12) United States Patent
Enichlmair et al.

(10) Patent No.: US 9,577,001 B2
(45) Date of Patent: Feb. 21, 2017

(54) INTEGRATED IMAGING DEVICE FOR INFRARED RADIATION AND METHOD OF PRODUCTION

(71) Applicant: ams AG, Unterpremstaetten (AT)

(72) Inventors: Hubert Enichlmair, Weinitzen (AT); Rainer Minixhofer, Unterpremstaetten (AT); Martin Schrems, Eggersdorf (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 14/889,835

(22) PCT Filed: Apr. 15, 2014

(86) PCT No.: PCT/EP2014/057648
§ 371 (c)(1),
(2) Date: Nov. 6, 2015

(87) PCT Pub. No.: WO2014/180635
PCT Pub. Date: Nov. 13, 2014

(65) Prior Publication Data
US 2016/0104741 A1    Apr. 14, 2016

(30) Foreign Application Priority Data
May 8, 2013    (EP) ..................... 13167095

(51) Int. Cl.
*H01L 29/04*    (2006.01)
*H01L 27/146*    (2006.01)
(Continued)

(52) U.S. Cl.
CPC .......... *H01L 27/14649* (2013.01); *G01J 5/022* (2013.01); *G01J 5/024* (2013.01);
(Continued)

(58) Field of Classification Search
CPC .................... H01L 27/14649; H01L 27/14636
(Continued)

(56) References Cited

U.S. PATENT DOCUMENTS 7,683,449 B2    3/2010  Minixhofer
2009/0256216 A1  10/2009  Kierse
(Continued)

FOREIGN PATENT DOCUMENTS

EP    1079613 A2    2/2001
EP    1248088 A1    10/2002
(Continued)

OTHER PUBLICATIONS

Sarro P.M. et al.: "An Integrated Thermal Infrared Sensing Array", Sensors and Actuators, vol. 14 (1988), pp. 191-201.
(Continued)

*Primary Examiner* — Anthony Ho
(74) *Attorney, Agent, or Firm* — McDermott Will & Emery LLP

(57) ABSTRACT

The integrated imaging device comprises a substrate (1) with an integrated circuit (4), a cover (2), a cavity (6) enclosed between the substrate (1) and the cover (2), and a sensor (5) or an array of sensors (5) arranged in the cavity (6). A surface (11, 12) of the substrate (1) or the cover (2) opposite the cavity (6) has a structure (8) directing incident radiation. The surface structure (8) may be a plate zone or a Fresnel lens focusing infrared radiation and may be etched into the surface of the substrate or cover, respectively.

27 Claims, 8 Drawing Sheets

(51) Int. Cl.
  *H01L 31/0232* (2014.01)
  *G01J 5/04* (2006.01)
  *G01J 5/02* (2006.01)
  *G01J 5/08* (2006.01)
  *H01L 31/0368* (2006.01)
  *G01J 5/00* (2006.01)

(52) U.S. Cl.
  CPC .............. *G01J 5/0225* (2013.01); *G01J 5/045* (2013.01); *G01J 5/048* (2013.01); *G01J 5/0806* (2013.01); *H01L 27/14618* (2013.01); *H01L 27/14625* (2013.01); *H01L 27/14636* (2013.01); *H01L 27/14685* (2013.01); *H01L 31/02325* (2013.01); *H01L 31/03682* (2013.01); *G01J 2005/0077* (2013.01); *H01L 2924/0002* (2013.01)

(58) Field of Classification Search
  USPC ......................................................... 257/49
  See application file for complete search history.

(56) References Cited

U.S. PATENT DOCUMENTS

| | | |
|---|---|---|
| 2011/0147869 A1 | 6/2011 | Lazarov et al. |
| 2011/0147872 A1 | 6/2011 | Inoue et al. |
| 2012/0056291 A1 | 3/2012 | Suzuki et al. |

FOREIGN PATENT DOCUMENTS

| | | |
|---|---|---|
| EP | 1267399 A2 | 12/2002 |
| EP | 1612528 A2 | 1/2006 |
| JP | H08174563 A | 7/1996 |
| JP | H09113352 A | 5/1997 |
| JP | 200665108 A | 3/2006 |
| JP | 2007-171170 A | 7/2007 |
| JP | 2007171174 A | 7/2007 |

OTHER PUBLICATIONS

Sptizer et al.: "Infrafred Absorbtion in n-Type Silicon", Physical Review, vol. 108, No. 2 (1957), pp. 268-271.

INTEGRATED IMAGING DEVICE FOR INFRARED RADIATION AND METHOD OF PRODUCTION

BACKGROUND OF THE INVENTION

Imaging devices and sensor devices for the detection of radiation are often provided with elements like lenses to direct the radiation. For infrared radiation (IR) of long wavelengths in the range between 8 µm and 12 µm (LWIR), an amorphous material transmitting infrared radiation (AM-TIR) like ZnSe or GeAsSe can be used to guide or focus the radiation. A mass production of such infrared detectors is prevented by prohibitive costs, which are also due to the packaging combining the detector with an integrated circuit.

A Fresnel lens comprises a plurality of concentric annular sections of different radii. Thus the continuous surface of a conventional lens is divided into annular surfaces of similar curvature, which are arranged contiguous to one another with steps in the surface where adjacent sections join. In each section the maximal thickness is considerably smaller than the maximal thickness of an equivalent conventional lens, so that the overall thickness of a Fresnel lens and hence its volume are much smaller in relation to a conventional lens.

A zone plate, sometimes called Fresnel zone plate, comprises a plurality of concentric annular sections of different radii, the so-called Fresnel zones. Opaque zones and transparent zones alternate in the area of the zone plate. Incident light is subject to diffraction around the opaque zones. The zones can be arranged so that the diffracted light constructively interferes at a desired focus.

US 2011/0147869 A1 discloses an integrated infrared-sensor comprising a Fresnel lens integrated in the rear surface of a silicon substrate. A cavity is etched into the substrate through openings in a dielectric stack. Polysilicon and titanium nitride layers extend through the openings between thermopiles arranged in the dielectric stack. A CMOS circuitry is arranged in a block of the dielectric stack.

EP 1 267 399 A2 discloses an infrared sensor comprising a resistance element in a cavity formed by a recess in a silicon substrate and by a cap body comprising a silicon substrate. The cap body carries a filter layer and a silicon layer, which is patterned to provide a Fresnel lens. A transistor is arranged on the substrate within the cavity, laterally with respect to the resistance element.

JP 2007-171174 A discloses an infrared sensing device comprising an infrared sensing part arranged in a cavity, which is formed by two silicon wafers. Through-hole wirings are electrically connected to the infrared sensing part. A semiconductor lens part is integrally formed in the upper silicon wafer.

US 2011/0147872 A1 discloses an optical device with a light receiving part arranged on a semiconductor device, which is covered with a transparent board comprising an integrated Fresnel lens. A layer of an adhesive material may comprise an opening above the light receiving part.

EP 1 079 613 A2 discloses an image input apparatus with a microlens array and a corresponding photosensitive element array.

EP 1 612 528 A2 discloses an infrared sensor comprising a sensor chip and a cap chip, which form a cavity accommodating an absorbing layer on a membrane above a recess of the sensor chip. The cap chip is provided with a lens, which can be integrated in the cap chip or in a silicon lens chip.

US 2012/0056291 A1 discloses an imaging device comprising a substrate, a photodetecting portion, a circuit portion and a through interconnect. The construction includes a lens.

US 2009/0256216 A1 discloses a wafer level chip scale package die substrate containing electronic circuits. Through-silicon vias through the substrate connect the electronic circuits to the bottom surface of the substrate. A package sensor is coupled to the substrate for sensing an environmental parameter. A protective encapsulant layer covers the top surface of the substrate except for a sensor aperture that is located above the package sensor.

U.S. Pat. No. 7,683,449 B2 discloses a radiation-detecting optoelectronic component including a semiconductor device with at least one radiation-sensitive zone configured to detect electromagnetic radiation and an optical element configured to focus the electromagnetic radiation in the radiation-sensitive zone. The optical element includes a diffractive element having structures in the same order of magnitude as the wavelength of the electromagnetic radiation.

The paper of P. M. Sarro et al.: "An integrated thermal infrared sensing array" in Sensors and Actuators 14, 191-201 (1988) reports an application of an external Fresnel zone plate for focusing infrared radiation on pixels of a detector. The spectral decomposition generated by the zone plate is used for infrared spectroscopy.

The absorption coefficient of doped silicon for infrared radiation was published by W. Spitzer and H. Y. Fan, "Infrared Absorption in n-Type Silicon," Physical Review 108, 268-271 (1957). If the attenuation of incident radiation by free carrier absorption in silicon is desired to be smaller than 10% within a silicon thickness of 700 µm, for example, the doping concentration must be smaller than $10^{17}$ cm$^{-3}$.

SUMMARY OF THE INVENTION

The integrated imaging device comprises a substrate comprising an integrated circuit, a cover, a dielectric layer between the substrate and the cover, a cavity that is enclosed between the substrate and the cover, and a sensor or an array of sensors arranged in the cavity. The cover comprises silicon bonded to silicon oxide forming a surface of the dielectric layer, and the cavity is a vacuum or comprises a gas pressure of less than 100 Pa or even less than 10 Pa. A surface of the substrate opposite the dielectric layer in the area of the cavity has a structure directing incident radiation to the sensor or array of sensors, or a surface of the cover opposite the dielectric layer in the area of the cavity has a structure directing incident radiation to the sensor or array of sensors.

In an embodiment of the integrated imaging device, the surface structure is a zone plate for focusing infrared radiation.

In a further embodiment of the integrated imaging device, the surface structure is a Fresnel lens for focusing infrared radiation.

In further embodiments the surface structure is formed in semiconductor material.

In a further embodiment the sensor or array of sensors comprises a diode having a pn junction formed in polysilicon.

In a further embodiment at least one metallization layer is embedded in the dielectric layer, and at least one electrically conductive connection of the sensor or array of sensors to the metallization layer extends from the cavity into the dielectric layer.

In a further embodiment, the sensor or array of sensors comprises a membrane integrally formed with the electrically conductive connection. In particular, the membrane is electrically connected to the integrated circuit and forms a passive infrared detector. The membrane may be electrically resistive or it may comprise a pn junction forming a diode.

In a further embodiment the cavity extends into the substrate and into the cover. In a further embodiment the cavity extends into the substrate and forms compartments separated by components of the integrated circuit, each sensor being arranged in or above one of the compartments.

In a further embodiment the cavity is arranged in the dielectric layer and extends into the cover.

In a further embodiment at least one through-substrate via is arranged in the substrate. The through-substrate via electrically connects the integrated circuit or the sensor or array of sensors with a connection pad on the surface of the substrate opposite the dielectric layer.

In a further embodiment the through-substrate via is not filled with electrically conductive or dielectric material, and the cover is bonded to the dielectric layer above the through-substrate via.

In a further embodiment the integrated circuit is a CMOS circuit, and the dielectric layer comprises a wiring of the integrated circuit.

The method of producing an integrated imaging device comprises the steps of providing a substrate with an integrated circuit and with a dielectric layer, at least a surface of the dielectric layer being formed by a silicon oxide, arranging a sensor or an array of sensors on or above the substrate, and applying a cover comprising silicon on the substrate by bonding the silicon of the cover to the silicon oxide of the dielectric layer, thus forming a cavity in which the sensor or array of sensors is arranged. A surface of the substrate opposite the dielectric layer or a surface of the cover opposite the dielectric layer is etched to produce a structure directing incident radiation to the sensor or array of sensors.

In a variant of the method, the cavity is formed such that it is a vacuum or comprises a gas pressure of less than 100 Pa or even less than 10 Pa.

In a further variant of the method, the surface structure is etched to form concentric annular depressions of a zone plate.

In a further variant of the method, the surface structure is etched to form a Fresnel lens.

In a further variant of the method, the surface in which the Fresnel lens is to be etched is covered with a patterning layer, which is structured according to the Fresnel lens. Then the patterning layer is removed by an anisotropic etching process, which transfers the structure of the patterning layer into the surface, thus forming the Fresnel lens.

In a further variant of the method, the surface in which the Fresnel lens is to be etched is silicon, and the patterning layer is formed from a polymer having the same etch rate as silicon.

In a further variant of the method, the sensor or array of sensors is arranged in the dielectric layer, a recess is etched in the substrate under the sensor or array of sensors, and the dielectric layer is then at least partially removed from the sensor or array of sensors.

In a further variant of the method, the sensor or array of sensors is arranged on a sacrificial layer and in the dielectric layer, the sacrificial layer is then removed, and the dielectric layer is at least partially removed from the sensor or array of sensors.

In a further variant of the method, the sensor or array of sensors is formed including a diode having a pn junction formed in polysilicon.

In a further variant of the method, the sensor or array of sensors is formed including a membrane, which is integrally structured together with electrically conductive connections connecting the membrane to metallization layers in the dielectric layer. The membrane may be electrically resistive and may be formed from a semiconductor material like polysilicon, which can be doped to obtain the desired resistivity. The membrane can be provided with a pn junction, which may especially be formed in polysilicon by an implantation of dopants.

The following is a detailed description of examples of the imaging device and of the method in conjunction with the appended figures.

DETAILED DESCRIPTION

Figure 1:
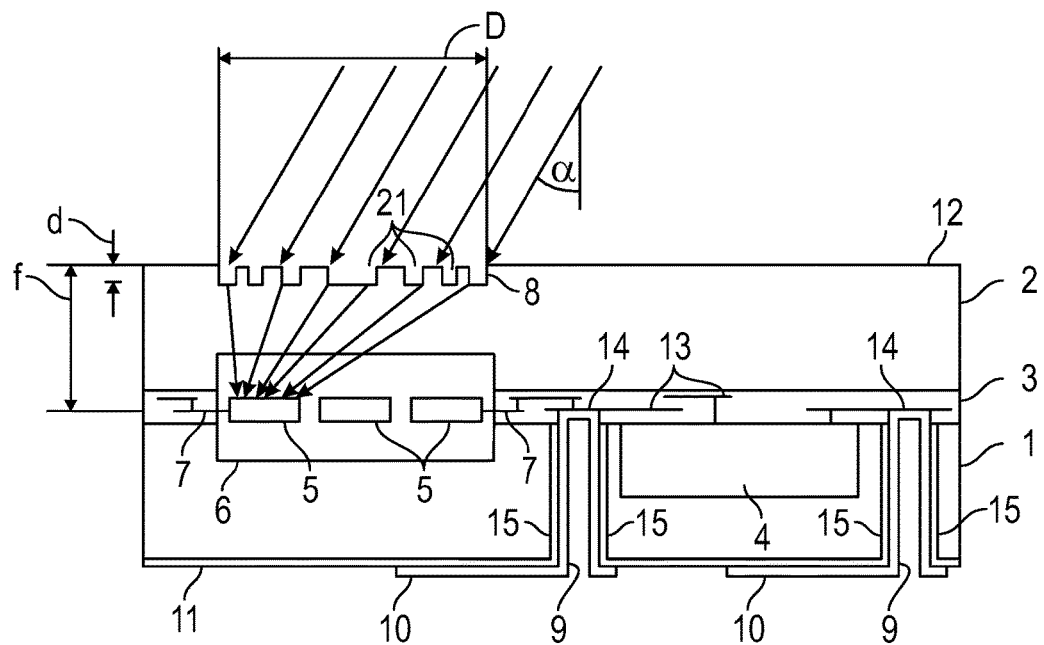
FIG. 1 is a cross section of an embodiment of the imaging device having sensors and an integrated circuit arranged at the same surface of the substrate.

FIG. 1 is a cross section of an embodiment of the imaging device. A substrate 1 of semiconductor material like silicon is connected with a cover 2, which may be a further semiconductor substrate. The substrate 1 and the cover 2 are connected by a dielectric layer 3, which may be an oxide of the semiconductor material, for instance. At least the surface of the dielectric layer 3 that is in contact with the cover 2 is formed by a silicon oxide like $SiO_2$, for instance. The cover 2 comprises silicon, which is bonded to the silicon oxide forming the surface of the dielectric layer. The connection may be produced by a wafer bonding method which is known per se. Such a wafer bonding method can be performed under vacuum, so that the cavity 6 formed between the substrate 1 and the cover 2 can be a vacuum or comprise a low gas pressure of less than 100 Pa or even less than 10 Pa. The substrate 1 comprises an integrated circuit 4, and metallization layers 13 may be embedded in the dielectric layer 3 to provide a wiring for the integrated circuit 4. The integrated circuit can especially be a CMOS circuit.

An array of sensors 5 is arranged in the cavity 6 that is formed between the substrate 1 and the cover 2. The sensors 5 of the array can be arranged for the detection of a two-dimensional image, for instance. A single sensor 5 may instead be arranged in the cavity 6. The sensor 5 or array of sensors 5 can be provided for the detection of infrared radiation and may comprise a passive infrared detector, for example.

Passive infrared (PIR) detectors can be realized in various ways, which are known per se and need not be described here. Passive infrared detectors usually comprise detector elements with the property that the resistance and hence the applied voltage or current changes when the detector element is heated by infrared radiation. In particular, the detector element may comprise a membrane of a material that is suitable for this application, like polysilicon, for example.

Each sensor 5 may be thermally isolated from the substrate 1 by a vacuum provided in the cavity 6. This may be accomplished by wafer bonding in vacuum, as mentioned above, in order to achieve the required pressure of typically less than 100 Pa or even less than 10 Pa in the cavity 6 around the detector element. The sensors 5 are provided with electrically conductive connections 7 connecting the sensors 5 with further conductors, especially with the metallization layers 13 of the wiring, for example.

A surface structure 8 is provided in the outer surface 12 of the cover 2 opposite the cavity 6. The surface structure 8 is designed to direct the incident radiation and may especially form a zone plate or a Fresnel lens for focusing infrared radiation. A zone plate forming the surface structure 8 can be produced photolithographically in silicon, for example, by coating the surface 12 with a resist, which is exposed to light according to the pattern of the zone plate, developed and partially removed to form a resist mask. Then the uncovered area of the silicon surface is etched by means of a plasma containing chlorine or bromide ions, for instance, to form the desired surface structure 8.

The arrows in FIG. 1 represent an example of incident radiation and illustrate the focusing effect of a zone plate. The direction of the radiation makes an angle $\alpha$ with the normal to the surface 12. The parallel rays are focused into one of the sensors 5.

The optical path length is the product of the index of refraction and the geometrical path length. The index of refraction is about 1 in air and, in the wavelength region of interest, about 3.4 in silicon, which may be the material of the cover 2. Therefore the optical path length of radiation propagating in silicon is about 3.4 times as long as the optical path length in air, even if the geometrical length of the path is the same. Consequently, the incident radiation entering the silicon in a recess of the surface covers an optical path that is shorter than the optical path of radiation entering the silicon in the planar area of the silicon surface. If the difference in the optical path lengths is half the wavelength, the resulting imaging properties are comparable with an optical lens. Other materials of high index of refraction can be used instead of silicon as the material forming the surface structure 8.

In the example of a zone plate, the surface structure 8 comprises a plurality of concentric annular depressions 21 or shallow circular trenches, which are separated by areas that have an upper surface lying within the plane of the surface 12. The latter areas have the same function as the opaque areas of a conventional zone plate, while the areas of the depressions 21 substitute the transparent areas of a conventional zone plate. The different optical path lengths that are due to the index of refraction of the cover 2 and the different surface levels in the area of the surface structure 8 produce a phase shift between the radiation impinging in the depressions 21 and the radiation impinging on the surface areas between the depressions 21. The phase shift creates an effect that is similar to the effect of the opaque and transparent zones of conventional zone plates. The depth d of the depressions 21 is adapted to the desired focal length f. The diameter D of the surface structure 8 may be typically 1 mm, for example. If the incident infrared radiation is emitted from a person approaching the sensor from a distance of a few meters and not coming closer than one meter, for example, the incoming rays are essentially parallel, and a zone plate of the specified diameter D generates an image of this person in the focal plane of the infrared detector.

One or more through-substrate vias 9 may be provided in the substrate 1 to connect the integrated circuit 4 and/or the sensors 5 to a connection pad 10 on the rear outer surface 11 of the substrate 1. The through-substrate via 9 can be connected to a contact area 14 of a metallization layer 13 and may be insulated from the semiconductor material of the substrate 1 by a via dielectric 15, which may be an oxide of the semiconductor material, for instance, and which can also be present at the rear outer surface 11.

If a through-substrate via 9 is not filled with electrically conductive or dielectric material, so that a void is left inside, as shown in FIG. 1, the cover 2 may be bonded to the dielectric layer 3 above the through-substrate via 9, according to FIG. 1. Thus the bottom of the through-substrate via 9 including the contact area 14 and part of the dielectric layer 3 is stabilized by the cover 2. It is therefore favorable that the cover 2 extends over the through-substrate vias 9. This arrangement of the cover 2 is also present in the embodiments according to FIGS. 2 to 5 and 14, which will be described in the following. The cover 2 may especially cover the entire area of the dielectric layer 3, further to the area occupied by the cavity 6.

Figure 2:
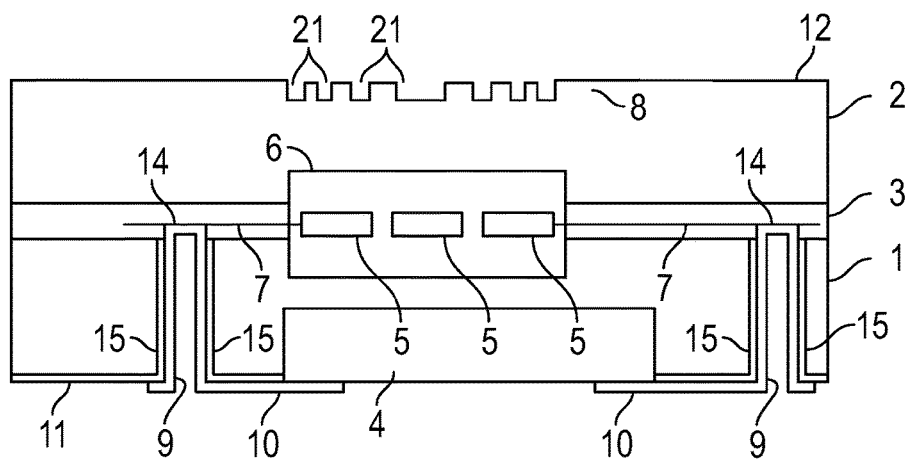
FIG. 2 is a cross section of a further embodiment of the imaging device having sensors and an integrated circuit arranged at opposite surfaces of the substrate.

FIG. 2 is a cross section of a further embodiment of the imaging device. Elements of the embodiment according to FIG. 2 that are similar to corresponding elements of the embodiment according to FIG. 1 are designated with the same reference numerals. In the embodiment according to FIG. 2, the integrated circuit 4 is arranged near the outer surface 11 of the substrate 1. A wiring of the integrated circuit 4 may be arranged on or above the outer surface 11 in a further dielectric layer, which is not shown in FIG. 2. The outer surface 12 of the cover 2 is provided with the surface structure 8 for the incidence of radiation. In this embodiment the integrated circuit 4 can be arranged opposite the cavity 6, so that the lateral dimension of this embodiment of the integrated imaging device can be reduced in comparison with the embodiment according to FIG. 1. In the embodiment according to FIG. 2, the cavity 6 may be a vacuum or comprise a gas pressure of typically less than 100 Pa or even less than 10 Pa. This can be achieved by bonding silicon of the cover 2 to silicon oxide forming the surface of the dielectric layer 3, as described above.

Figure 3:
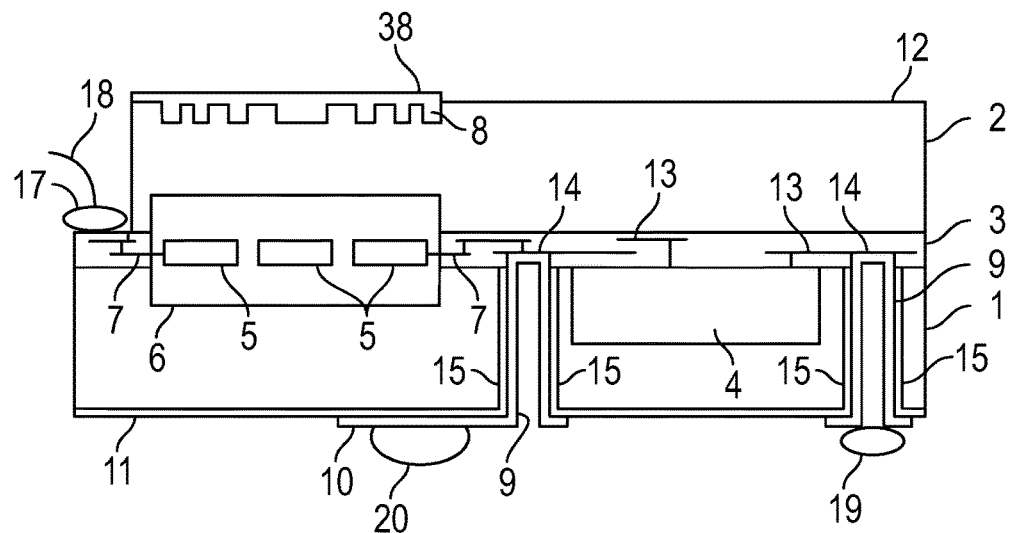
FIG. 3 is a cross section of a further embodiment of the imaging device with arrangements of solder bumps.

FIG. 3 is a cross section of a further embodiment of the imaging device with arrangements of solder bumps. Elements of the embodiment according to FIG. 3 that are similar to corresponding elements of the embodiment according to FIG. 1 are designated with the same reference numerals. In the embodiment according to FIG. 3, a solder bump 17 is arranged on a contact area of a metallization layer 13, which is not covered by the cover 2. A wire 18 is used to connect the solder bump 17 to external terminals by a conventional wire bonding technique. Solder bumps 19, 20 may also be arranged on the rear outer surface 11 of the substrate 1. One of these solder bumps 19 electrically connects one of the through-substrate vias 9 and covers the opening of the through-substrate via 9. A further solder bump 20 is arranged on a connection pad 10 of a further through-substrate via 9. FIG. 3 also shows how the surface structure 8 may be covered with a passivation or antireflective coating 38, which may be similarly applied on the surface structures 8 of the other embodiments. In the embodiment according to FIG. 3, the cavity 6 may be a vacuum or comprise a gas pressure of typically less than 100 Pa or even less than 10 Pa. This can be achieved by bonding silicon of the cover 2 to silicon oxide forming the surface of the dielectric layer 3, as described above.

Figure 4:
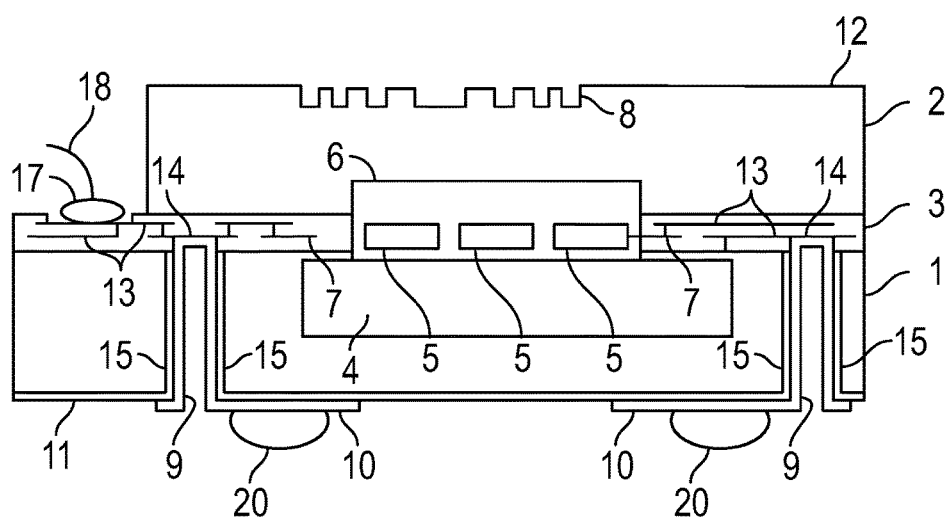
FIG. 4 is a cross section of a further embodiment having sensors in the vicinity of an integrated circuit.

FIG. 4 is a cross section of a further embodiment wherein the sensors 5 are arranged in the vicinity of the integrated circuit 4. Elements of the embodiment according to FIG. 4 that are similar to corresponding elements of the embodiment according to FIG. 3 are designated with the same reference numerals. In the embodiment according to FIG. 4, the cavity 6 does not extend into the substrate 1, but occupies a volume of the dielectric layer 3 and only extends into the cover 2. The cavity 6 may especially penetrate the dielectric layer 3, thus reaching the surface of the substrate 1, as shown in FIG. 4. In this way the integrated circuit 4 can be arranged facing the cover 2, and the sensors 5 can be arranged between the integrated circuit 4 and the cover 2. In the embodiment according to FIG. 4, the cavity 6 may be a vacuum or comprise a gas pressure of typically less than 100 Pa or even less than 10 Pa. This can be achieved by bonding silicon of the cover 2 to silicon oxide forming the surface of the dielectric layer 3, as described above.

Figure 5:
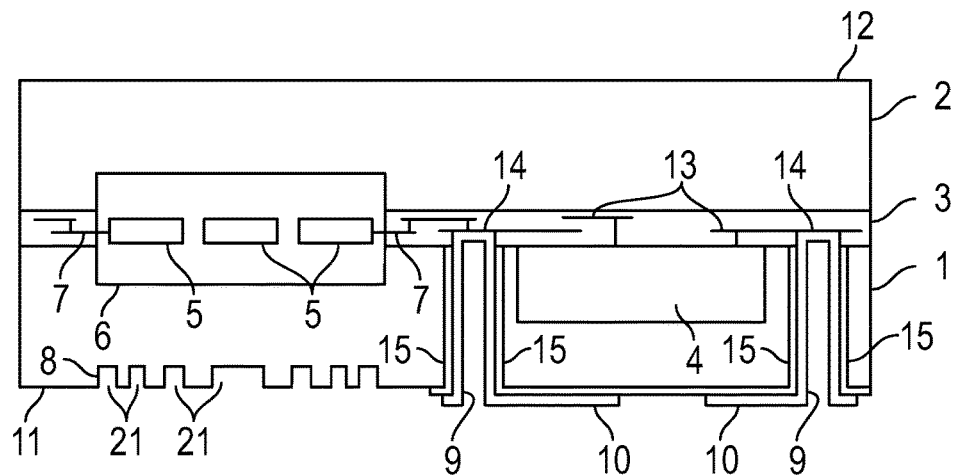
FIG. 5 is a cross section of a further embodiment having a zone plate on the rear substrate surface.

FIG. 5 is a cross section of a further embodiment having a zone plate on the rear outer surface 11 of the substrate 1. Elements of the embodiment according to FIG. 5 that are similar to corresponding elements of the embodiment according to FIG. 1 are designated with the same reference numerals. In the embodiment according to FIG. 5, the surface structure 8 is formed in the rear outer surface 11 of the substrate 1 opposite the cavity 6. The outer surface 12 of the cover 2 may be planar. In the embodiment according to FIG. 5, the area of the rear outer surface 11 of the substrate 1 that comprises the surface structure 8 is provided for the incidence of radiation. In the embodiment according to FIG. 5, the cavity 6 may be a vacuum or comprise a gas pressure of typically less than 100 Pa or even less than 10 Pa. This can be achieved by bonding silicon of the cover 2 to silicon oxide forming the surface of the dielectric layer 3, as described above.

Figure 6:
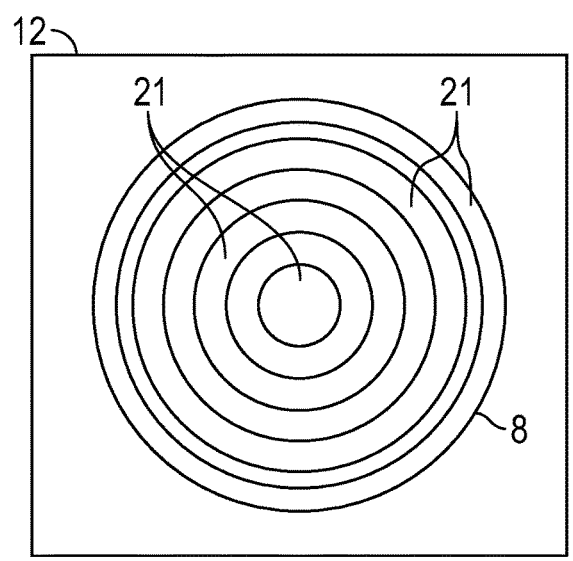
FIG. 6 is a top view of a surface structure forming a zone plate.

FIG. 6 is a schematic top view of a surface structure 8 forming a zone plate on the outer surface 12 of the cover 2. The depressions 21 are arranged as concentric annular trenches in the surface 12. The width of the depressions 21 is adapted to the function of the zone plate in view of the wavelength of the radiation to be detected.

Figure 7:
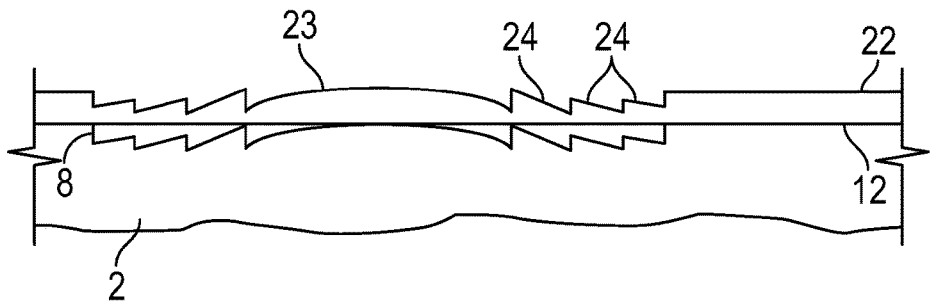
FIG. 7 is a cross section of a cover showing a region near a surface carrying a patterning layer.

FIG. 7 is a cross section of a part of the cover 2 and shows a region near the outer surface 12. A patterning layer 22 is applied to the planar surface 12 and is provided with the structure that is intended for the surface structure 8 to be produced. When the patterning layer 22 is applied to the surface 12, the surface structure 8, which is indicated in FIG. 7, is not yet present. The material of the patterning layer 22 may be selected to enable an etching with the same or at least almost the same etch rate as the material of the cover 2. If the cover 2 is silicon, the patterning layer 22 may be a polymer, for instance, which can be structured by a nano imprint step, for example. Then the patterning layer is removed by an anisotropic etching process, in particular by reactive ion etching, and in this anisotropic etching step the structure of the patterning layer 22 is transferred into the surface 12 of the cover 2. In the embodiment shown in FIG. 7 the transferred surface structure 8 is a Fresnel lens, but it may instead be a zone plate or another suitable surface structure.

In the example shown in FIG. 7, the surface structure 8 to be produced is a Fresnel lens comprising a central section 23 and a plurality of concentric annular peripheral sections 24 of different radii. The curvatures of the surfaces of the peripheral sections 24 may correspond to peripheral annular sections of a single lens, which thus appear vertically shifted with respect to one another at the boundaries of the peripheral sections 24 of the Fresnel lens. Instead there may be other curvatures, or the surfaces of the peripheral sections 24 may be planar or at least approximately planar in order to facilitate the manufacturing process, for example.

An example of a method of producing the integrated imaging device will be described in conjunction with FIGS. 8 to 12, which show cross sections of intermediate products of the method after different method steps. The intermediate products are obtained after the integrated circuit 4 and the dielectric layer 3 with embedded metallization layers 13 of the wiring have been produced and before the cover 2 is applied to the substrate 1.

Figure 8:
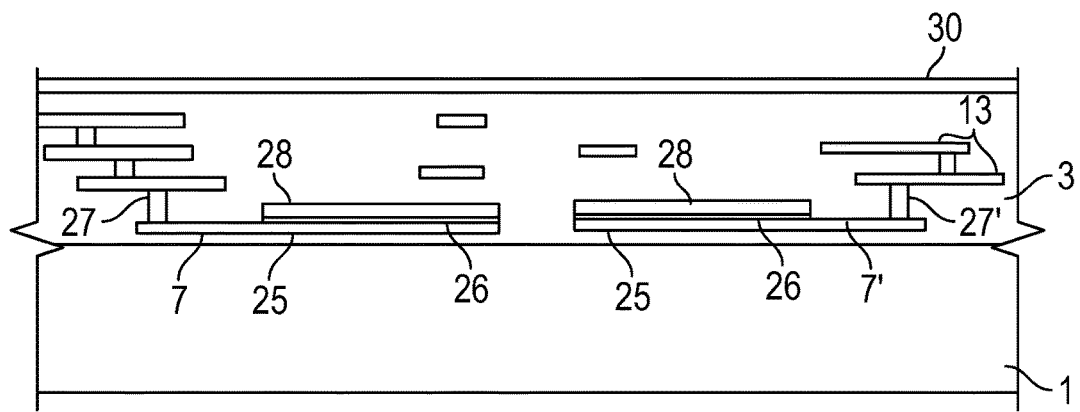
FIG. 8 is a cross section of an intermediate product of an example of the method of production.

FIG. 8 shows a cross section of a substrate 1 of a semiconductor material like silicon covered by a dielectric layer 3, which may be an oxide of the semiconductor material, for instance. Metallization layers 13 are embedded in the dielectric layer 3 to provide a wiring for the integrated circuit. A layer structure is provided for a sensor like one of the sensors 5 of the embodiments described above and comprises a membrane 25, which may be polysilicon, for instance, and an absorber layer 26, which may be silicon oxide, for instance. An optional absorbing layer 28, which may be titanium nitride, for instance, may be arranged on the absorber layer 26, as shown in FIG. 8. The layer structure is embedded in the dielectric layer 3. The arrangement shown in FIG. 8 is provided for radiation passing through the substrate 1. If the radiation is to pass through the cover 2, the sequence of layers provided for the sensor may be reversed.

The resistance of the membrane 25 changes when infrared radiation impinges on the membrane 25. The variation of the resistance can be detected by applying a voltage or a current to the membrane 25. To this end the membrane 25 is provided with electrically conductive connections 7, 7' which may be formed from the same material as the membrane 25. In this case the membrane 25 and the connections 7, 7' may be produced together by applying a layer of the material that is provided for the membrane 25 and structuring this layer into the membrane 25 and the connections 7, 7'. The membrane 25 is thus integrally formed with the electrically conductive connections 7, 7'. If the membrane 25 and the connections 7, 7' are polysilicon, for instance, the membrane 25 can be provided with a desired resistivity by doping the polysilicon with an appropriate concentration of a dopant, and the connections 7, 7' may be doped at a higher concentration of the dopant in order to enhance their electric conductivity. Thus an electrically resistive membrane 25 with low-ohmic connections 7, 7' is obtained.

Plugs 27, 27' may be provided to connect the connections 7, 7' with a metallization layer 13 of the wiring. Thus the membrane 25 is electrically connected to the integrated circuit and/or to external contact pads. The electric connection of the sensor may include through-substrate vias in the substrate 1 as described above. The upper surface of the dielectric layer 3 may be covered with a passivation layer 30.

Figure 9:
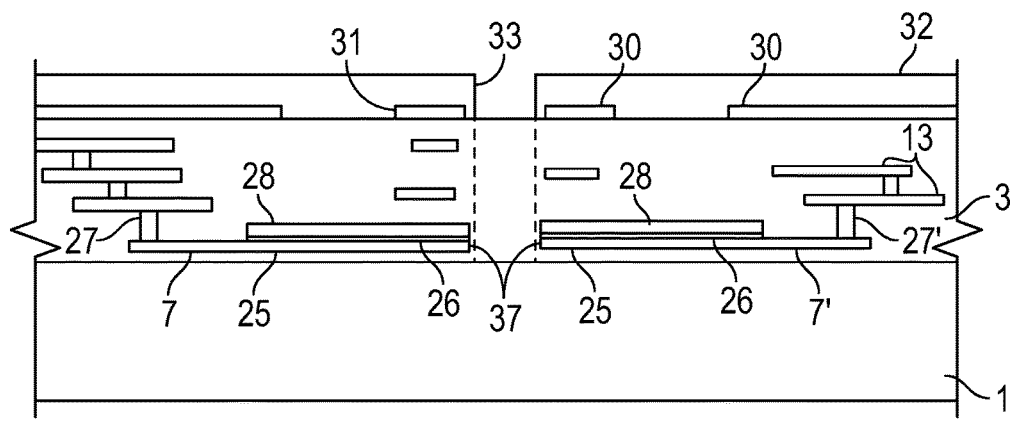
FIG. 9 is a cross section according to FIG. 8 after the application of a mask layer.

FIG. 9 is a cross section according to FIG. 8 showing a further intermediate product after the structuring of the passivation layer 30 and after the application of a mask layer 32. Elements of the intermediate product according to FIG. 9 that are similar to corresponding elements of the intermediate product according to FIG. 8 are designated with the same reference numerals. The passivation layer 30 comprises several openings 31, and the mask layer 32 comprises a mask window 33 in the area of one of the openings 31 above a central opening 37 of the membrane 25 and the absorber layer 26. If the optional absorbing layer 28 is provided, the central opening 37 is also present in the optional absorbing layer 28. The broken lines in FIG. 9 show a region of the dielectric layer 3 that is subsequently removed in an etch step to produce an opening in the dielectric layer 3. Through this opening a recess can be etched in the substrate 1 under the layer sequence 25, 26, 28 provided for the sensor.

Figure 10:
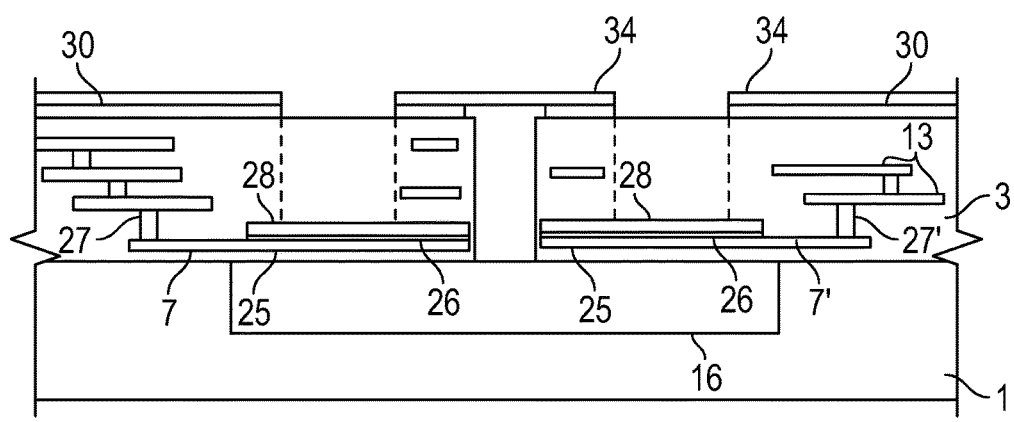
FIG. 10 is a cross section according to FIG. 9 after the formation of a recess in the substrate.

FIG. 10 is a cross section according to FIG. 9 showing a further intermediate product after the formation of a recess 16 in the substrate 1. Elements of the intermediate product according to FIG. 10 that are similar to corresponding elements of the intermediate product according to FIG. 9 are designated with the same reference numerals. The recess 16 of the substrate 1 can be produced by an isotropic etching through the opening in the dielectric layer 3 that has previously been produced using the mask layer 32. A dry film 34 may be applied to cover the opening of the dielectric layer 3 and the recess 16. Above the layer sequence of the sensor, the dry film 34 may be structured according to the passivation layer 30, so that the regions of the dielectric layer 3 indicated in FIG. 10 by broken lines can subsequently be removed using the dry film 34 as a mask.

Figure 11:
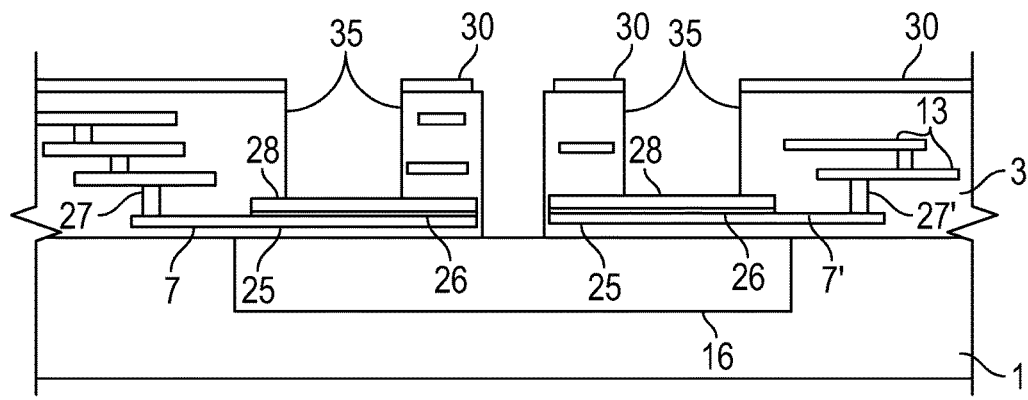
FIG. 11 is a cross section according to FIG. 10 after a further etching step.

FIG. 11 is a cross section according to FIG. 10 after a further etching step to form a trench 35 above the layer sequence 25, 26, 28 provided for the sensor. The trench 35 is provided as a thermal isolation of the sensor. Then the dry film 34 may be removed. The cover 2 can then be applied to the resulting device structure shown in FIG. 11 to form the cavity 6 as described above.

Figure 12:
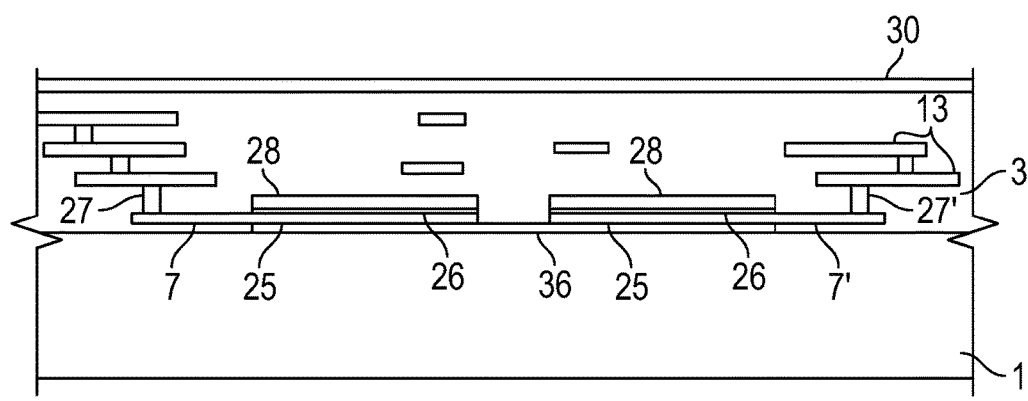
FIG. 12 is a cross section according to FIG. 8 for a variant of the method.

FIG. 12 is a cross section according to FIG. 8 for a variant of the method. Elements of the intermediate product according to FIG. 12 that are similar to corresponding elements of the intermediate product according to FIG. 8 are designated with the same reference numerals. In the embodiment according to FIG. 12, the layer sequence comprising the membrane 25, the absorber layer 26 and the optional absorbing layer 28 provided for the sensor is arranged on a sacrificial layer 36. The material of the sacrificial layer 36 may be chosen so that it can be selectively etched with respect to the dielectric layer 3, to the layer sequence provided for the sensor and to the semiconductor material of the substrate 1.

Instead of etching a recess in the substrate 1, as in the preceding example according to FIGS. 8 to 11, only the sacrificial layer 36 is removed to separate the sensor membrane 25 from the semiconductor material of the substrate 1. As the substrate 1 here remains unaltered during the formation of the cavity 6, the integrated circuit can be placed in the region immediately under the sensor, as in the embodiment according to FIG. 4, for example.

Figure 13:
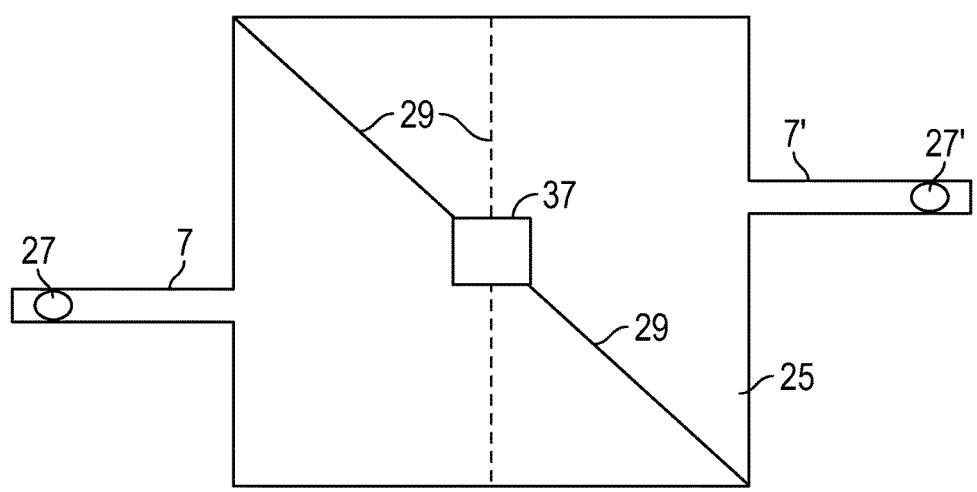
FIG. 13 is a top view of an example of a membrane that is applied to form a sensor.

FIG. 13 is a top view of an example of the membrane 25 of the sensor. The central opening 37 is used to etch the recess 16 according to FIGS. 10 and 11 or to remove the sacrificial layer 36 shown in FIG. 12, respectively. The connections 7, 7' may be formed as integral parts of the layer of the membrane 25 and may be provided with the plugs 27, 27'. The membrane 25 may be provided with a pn junction 29, which traverses the membrane 25 as shown in FIG. 13 by way of example. If the membrane 25 is in the shape of a square, the pn junction 29 may be arranged along the diagonal, for instance, but other positions of the pn junction 29 may be suitable as well, as indicated by the vertical broken line in FIG. 13. The pn junction 29 may run along a straight line or be curved. If the membrane 25 is a semiconductor material like polysilicon, the pn junction 29 can be formed by implantations of dopants for opposite types of conductivity. The doped membrane region of one type of conductivity is connected to the metallization layers 13 via the connection 7 and the plug 27, and the doped membrane region of the opposite type of conductivity is connected to the metallization layers 13 via the further connection 7' and the further plug 27'. The pn junction 29 forms a diode, which may be used for infrared detection instead of an electrical resistance. In both cases, using either a resistance or a diode, the effect of incident infrared radiation can be detected by measuring the induced change of the current through the resistance or diode at a predefined voltage or by measuring the induced change of the voltage that is required for the generation of a predefined current through the resistance or diode.

A diode comprising a pn junction can be provided instead of an electrical resistance or additionally to an electrical resistance. In particular, it is feasible that one or more sensors of the imaging device comprise an electrically resistive membrane while at least one further sensor of the device comprises a membrane with a pn junction.

Figure 14:
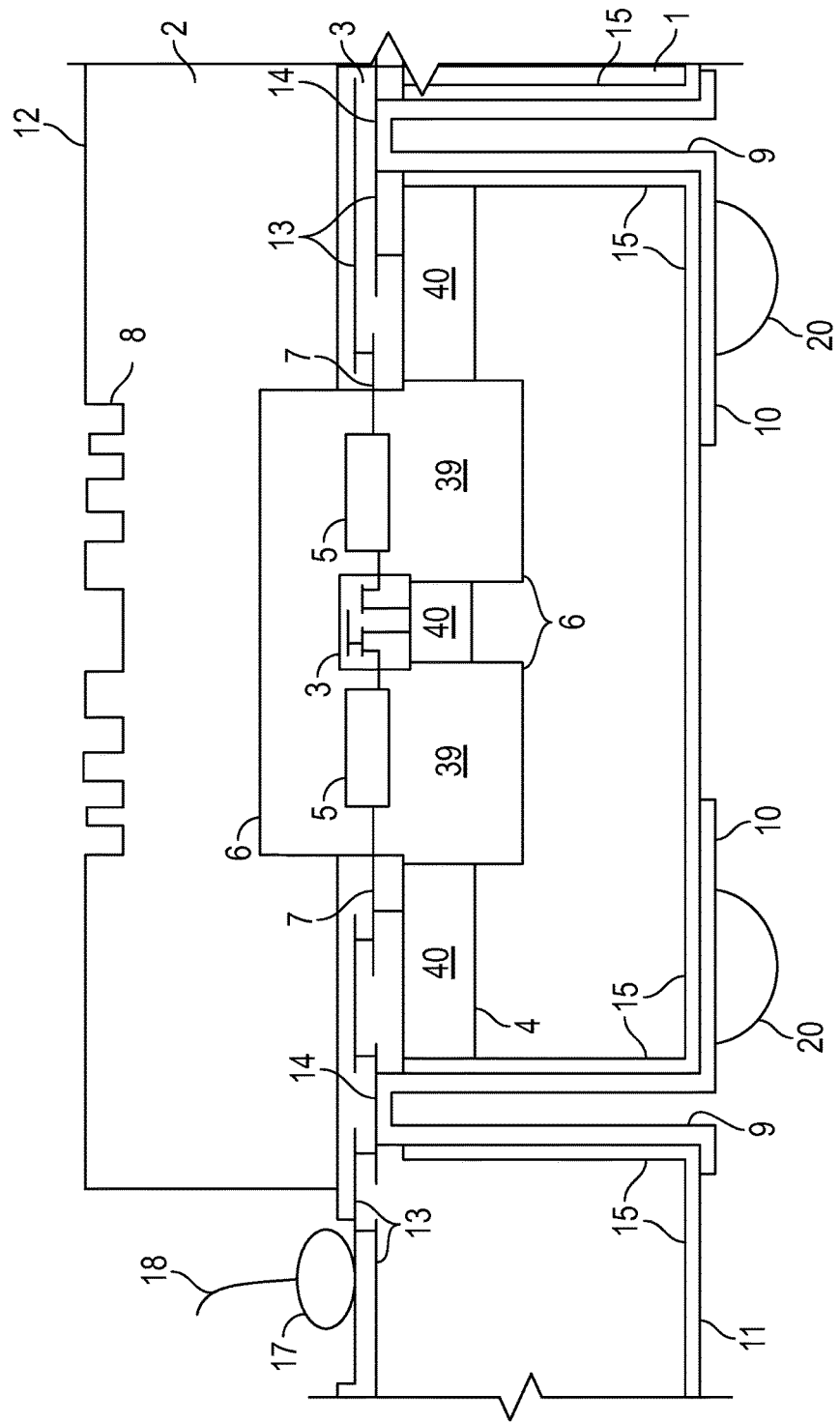
FIG. 14 is a cross section according to FIG. 4 of a further embodiment having an alternating arrangement of sensors and CMOS components.

FIG. 14 is a cross section of a further embodiment having an alternating arrangement of sensors 5 and integrated components 40, especially of a CMOS circuit. Elements of the embodiment according to FIG. 14 that are similar to corresponding elements of the embodiment according to FIG. 4 are designated with the same reference numerals. In the embodiment according to FIG. 14, the cavity 6 extends into the substrate 1 in regions between the components 40 of the integrated circuit 4, thus forming a plurality of separate compartments 39 for individual sensors 5, which are arranged in or above the compartments 39. There may be any number of compartments 39, as there may be any number of sensors 5. Each of the compartments 39 may be provided for one of the sensors 5, as indicated in FIG. 14, but a compartment 39 may instead be empty or provided for more than one sensor 5. Upper portions of the compartments 39 may be separated by a portion of the dielectric layer 3. An upper portion of the cavity 6 may extend into the cover 2 above the compartments 39 and above the dielectric layer 3, as shown in FIG. 14. Such an arrangement yields a cavity 6 that includes several or all the compartments 39 in common, and the same cavity 6 thus surrounds several or all the sensors 5.

The components 40 of the integrated circuit 4 between the compartments 39 can favorably be used for an amplification of the sensor signal or signals. The amplifier is thus arranged in the vicinity of the sensor or sensor array 5, so that compared to conventional devices, parasitic impedances are reduced and the signal-to-noise ratio is improved.

In the embodiment according to FIG. 14, the cavity 6 may be a vacuum or comprise a gas pressure of typically less than 100 Pa or even less than 10 Pa. This can be achieved by bonding silicon of the cover 2 to silicon oxide forming the surface of the dielectric layer 3, as described above.

This invention provides the first fully integrated on-chip infrared optical system composed of lenses and sensor elements and featuring an integrated circuit, optional wafer-level packaging including wafer bonding, and optional through-substrate vias or wirebond integration.

The invention claimed is:

1. An integrated imaging device, comprising:
a substrate comprising an integrated circuit;
a cover bonded to the substrate;
a dielectric layer between the substrate and the cover;
a sensor or an array of sensors;
a cavity enclosed between the substrate and the cover;
a surface of the substrate opposite the dielectric layer or a surface of the cover opposite the dielectric layer being provided with a structure directing incident radiation to the sensor or array of sensors;
the sensor or the array of sensors being arranged in the cavity;
the cavity being a vacuum or comprising a gas pressure of less than 100 Pa;
at least one metallization layer being embedded in the dielectric layer; and
at least one electrically conductive connection connecting the sensor or array of sensors to the metallization layer, the electrically conductive connection extending from the cavity into the dielectric layer,
wherein the dielectric layer is arranged laterally with respect to the cavity, and
wherein the at least one metallization layer extends from the dielectric layer to the sensor or array of sensors and thus forms the electrically conductive connection.

2. The integrated imaging device of claim 1, wherein the surface structure is a zone plate for focusing infrared radiation.

3. The integrated imaging device of claim 1, wherein the surface structure is a single spherical lens or a Fresnel lens for focusing infrared radiation.

4. The integrated imaging device of claim 1, wherein the sensor or array of sensors comprises a diode having a pn junction formed in polysilicon.

5. The integrated imaging device of claim 1, wherein the sensor or array of sensors comprises a membrane integrally formed with the electrically conductive connection.

6. The integrated imaging device of claim 5, wherein the membrane is electrically resistive.

7. The integrated imaging device of claim 5, wherein the membrane comprises a pn junction.

8. The integrated imaging device of claim 1, wherein the cavity extends into the substrate and into the cover.

9. The integrated imaging device of claim 1, further comprising:
at least one through-substrate via in the substrate, the through-substrate via electrically connecting the integrated circuit or the sensor or array of sensors with a connection pad on the surface of the substrate opposite the dielectric layer.

10. The integrated imaging device of claim 9, wherein the through-substrate via is not filled with electrically conductive or dielectric material, and the cover is bonded to the substrate above the through-substrate via.

11. An integrated imaging device, comprising:
a substrate comprising an integrated circuit;
a cover bonded to the substrate;
a dielectric layer between the substrate and the cover;
a plurality of sensors or an array of sensors;
a cavity enclosed between the substrate and the cover;
a surface of the substrate opposite the dielectric layer or a surface of the cover opposite the dielectric layer being provided with a structure directing incident radiation to the plurality of sensors or the array of sensors;
the plurality of sensors or the array of sensors being arranged in the cavity;
the cavity being a vacuum or comprising a gas pressure of less than 100 Pa; and
the cavity extending into the substrate, the substrate forming compartments of the cavity, the compartments being separated by components of the integrated circuit, each sensor being arranged in or above one of the compartments.

12. The integrated imaging device of claim 11, wherein the cavity is arranged in the dielectric layer and extends into the cover.

13. The integrated imaging device of claim 11, wherein the surface structure is a zone plate for focusing infrared radiation.

14. The integrated imaging device of claim 11, wherein the surface structure is a single spherical lens or a Fresnel lens for focusing infrared radiation.

15. The integrated imaging device of claim 11, wherein the sensor or array of sensors comprises a diode having a pn junction formed in polysilicon.

16. The integrated imaging device of claim 11, wherein the sensor or array of sensors comprises a membrane integrally formed with the electrically conductive connection.

17. The integrated imaging device of claim 16, wherein the membrane is electrically resistive.

18. The integrated imaging device of claim 17, wherein the membrane comprises a pn junction.

19. A method of producing an integrated imaging device, comprising:
providing a substrate with an integrated circuit, a dielectric layer and at least one metallization layer embedded in the dielectric layer, at least a surface of the dielectric layer being formed by a silicon oxide;
arranging a sensor or an array of sensors on or above the substrate;
forming at least one electrically conductive connection of the sensor or array of sensors to the metallization layer;
applying a cover comprising silicon on the substrate by bonding, thus forming a cavity in which the sensor or array of sensors is arranged, the electrically conductive connection extending from the cavity into the dielectric layer; and
etching a surface of the substrate opposite the dielectric layer or a surface of the cover opposite the dielectric layer to produce a structure directing incident radiation to the sensor or array of sensors.

20. The method of claim 19, wherein the cavity is formed such that it comprises a vacuum or a gas pressure of less than 100 Pa.

21. The method of claim 19, wherein the surface structure is etched to form a single spherical lens or a Fresnel lens.

22. The method of claim 21, wherein the surface in which the lens is to be etched is covered with a patterning layer; the patterning layer is structured according to the lens; and
the patterning layer is removed by an anisotropic etching process, which transfers the structure of the patterning layer into the surface.

23. The method of claim 22, wherein the surface in which the lens is to be etched is silicon, and
the patterning layer is formed from a polymer having the same etch rate as silicon.

24. The method of claim 19, further comprising:
the sensor or array of sensors being arranged in the dielectric layer;
a recess being etched in the substrate under the sensor or array of sensors; and
the dielectric layer being at least partially removed from the sensor or array of sensors.

25. The method of claim 19, further comprising:
the sensor or array of sensors being arranged on a sacrificial layer and in the dielectric layer;
the sacrificial layer being removed; and
the dielectric layer being at least partially removed from the sensor or array of sensors.

26. The method of claim 19, further comprising:
the sensor or array of sensors being formed including a membrane of polysilicon, which is integrally structured together with electrically conductive connections connecting the membrane to metallization layers in the dielectric layer.

27. The method of claim 26, further comprising:
providing the membrane with a pn junction.

* * * * *